US012740242B2

(12) United States Patent
Shim et al.

(10) Patent No.: US 12,740,242 B2
(45) Date of Patent: Sep. 15, 2026

(54) ORGANIC LIGHT EMITTING DISPLAY DEVICE AND ORGANIC LIGHT EMITTING DISPLAY PANEL WITH A FRONT AND REAR EMISSION-ENABLED STRUCTURE OF INCLUDING TRANSISTOR DRIVING ADJACENT LIGHT EMITTING ELEMENTS IN DIFFERENT EMISSION AREAS

(71) Applicant: LG Display Co., Ltd., Seoul (KR)

(72) Inventors: Sungbin Shim, Yangsan-si (KR); Sangpil Park, Incheon (KR)

(73) Assignee: LG Display Co., Ltd., Seoul (KR)

( * ) Notice: Subject to any disclaimer, the term of this patent is extended or adjusted under 35 U.S.C. 154(b) by 405 days.

(21) Appl. No.: 18/474,928

(22) Filed: Sep. 26, 2023

(65) Prior Publication Data

US 2024/0107807 A1 Mar. 28, 2024

(30) Foreign Application Priority Data

Sep. 27, 2022 (KR) ........................ 10-2022-0122896

(51) Int. Cl.
*H10K 59/121* (2023.01)
*H10K 59/123* (2023.01)
(Continued)

(52) U.S. Cl.
CPC ....... *H10K 59/1213* (2023.02); *H10K 59/123* (2023.02); *H10K 59/131* (2023.02);
(Continued)

(58) Field of Classification Search
CPC .. H10K 59/1213; H10K 59/131; H10K 59/38; H10K 59/878; H10K 59/123; H10K 59/8792; H10K 2102/3031
See application file for complete search history.

(56) References Cited

U.S. PATENT DOCUMENTS

2011/0148944 A1 6/2011 Kobayashi
2012/0178196 A1 7/2012 Park et al.
(Continued)

FOREIGN PATENT DOCUMENTS

KR 10-2011-0070816 A 6/2011
KR 10-2012-0081425 A 7/2012
KR 10-2014-0067455 A 6/2014

OTHER PUBLICATIONS

Korean Intellectual Property Office, Office Action, Korean Patent Application No. 10-2022-0122896, Jun. 23, 2025, 14 pages.

*Primary Examiner* — Norman D Richards
*Assistant Examiner* — Sean Ayers Winters
(74) *Attorney, Agent, or Firm* — Fenwick & West LLP

(57) ABSTRACT

An organic light emitting display panel and an organic light emitting display device are disclosed. Specifically, there may be provided an organic light emitting display panel and an organic light emitting display device capable of preventing a reduction in the emission area due to the repair area by including a thin film transistor including a first active layer disposed in the first emission area, a second active layer overlapping the second emission area of the first substrate, electrically connected to the thin film transistor, and disposed on the same layer as the first active layer, and a light emitting element electrically connected to the thin film transistor and including an anode electrode, a light emitting layer, and a cathode electrode disposed in the first emission area, wherein the light emitting layer and the cathode electrode are disposed on the second active layer in the second emission area.

22 Claims, 12 Drawing Sheets

(51) Int. Cl.

| | |
|---|---|
| ***H10K 59/131*** | (2023.01) |
| ***H10K 59/38*** | (2023.01) |
| ***H10K 59/80*** | (2023.01) |
| ***H10K 102/00*** | (2023.01) |

(52) U.S. Cl.

CPC ........... *H10K 59/38* (2023.02); *H10K 59/878* (2023.02); *H10K 59/8792* (2023.02); *H10K 2102/3031* (2023.02)

(56) References Cited

U.S. PATENT DOCUMENTS

| | | | | |
|---|---|---|---|---|
| 2017/0279084 | A1* | 9/2017 | Sakamoto | H10K 59/873 |
| 2019/0165065 | A1* | 5/2019 | Kong | H10K 59/126 |
| 2020/0185480 | A1* | 6/2020 | Heo | H10K 59/1315 |
| 2020/0212131 | A1* | 7/2020 | Kim | H10K 59/1315 |
| 2021/0134906 | A1* | 5/2021 | Lee | H10K 59/352 |

* cited by examiner

FIG. 7

AE
561 562 563
602
703 507
L1
820
701
CE
EL
731a 731b
531
RA
L2
CH1
CH2
CH3
X
PAD
NEA
EA2
NEA
EA1
NEA
TA
E
F
G
H

CH2
505
503
502
501
M
529
524
504
517
528
CA1
523
510
526
521
525
527
522
N
Repair
507
506
539
Cst
CA2
532
540
531
563
562
561
AE
CE
EL
CH1
507

ORGANIC LIGHT EMITTING DISPLAY DEVICE AND ORGANIC LIGHT EMITTING DISPLAY PANEL WITH A FRONT AND REAR EMISSION-ENABLED STRUCTURE OF INCLUDING TRANSISTOR DRIVING ADJACENT LIGHT EMITTING ELEMENTS IN DIFFERENT EMISSION AREAS

CROSS-REFERENCE TO RELATED APPLICATION

This application claims priority from Republic of Korea Patent Application No. 10-2022-0122896, filed on Sep. 27, 2022, which is hereby incorporated by reference in its entirety.

BACKGROUND

Field

Embodiments of the disclosure relate to an organic light emitting display panel and an organic light emitting display device.

Description of Related Art

An organic light emitting display device is used as a display device having various purposes and functions, such as a transparent display device in which image information and the background are viewed.

It is required to enhance the structural characteristics by securing the rear aperture ratio without loss of the front aperture ratio, so that viewers positioned on opposite sides may easily share the screen.

SUMMARY

In the field of conventional transparent displays that may be viewed from two opposite sides, the front emission area and the rear emission area may be reduced due to the transmissive area and the subpixel repair area.

Accordingly, the inventors of the disclosure have invented an organic light emitting display panel and an organic light emitting display device capable of including both a repair area and a transmissive area while increasing the area of the emission area.

Embodiments of the disclosure relate to an organic light emitting display panel and an organic light emitting display device capable of preventing or at least reducing a reduction in the emission area due to the repair area by disposing the repair pattern disposed in the repair area to overlap the active layer and the first emission area.

Embodiments of the disclosure relate to an organic light emitting display panel and an organic light emitting display device capable of reducing damage due to etching while simplifying the process by including the active layer in the electrode included in the emission area and the repair pattern.

Embodiments of the disclosure relate to an organic light emitting display panel and an organic light emitting display device capable of adjusting the color coordinates of each emission area while enhancing the luminance of the rear emission area as well as the front emission area.

Embodiments of the disclosure may provide an organic light emitting display device comprising a first substrate including at least one first emission area and at least one second emission area, a thin film transistor including a first active layer disposed in the first emission area of the first substrate, a second active layer overlapping the second emission area of the first substrate, electrically connected to the thin film transistor, and disposed on the same layer as the first active layer, and a light emitting element electrically connected to the thin film transistor and including an anode electrode, a light emitting layer, and a cathode electrode disposed in the first emission area, wherein the light emitting layer and the cathode electrode are disposed on the second active layer in the second emission area, wherein light emitted from the first emission area is emitted in one direction, and wherein at least a portion of light emitted from the second emission area is emitted in a direction different from the one direction in which the light emitted from the first emission area is emitted.

Embodiments of the disclosure may provide an organic light emitting display panel comprising a first substrate including at least one first emission area and at least one second emission area, a thin film transistor disposed in the first emission area of the first substrate and including a first active layer, a second active layer overlapping the second emission area of the first substrate, electrically connected to the thin film transistor, and disposed on the same layer as the first active layer, and a light emitting element electrically connected to the thin film transistor and including an anode electrode, a light emitting layer, and a cathode electrode disposed in the first emission area, wherein the light emitting layer and the cathode electrode are disposed on the active layer of the second emission area.

According to embodiments of the disclosure, there may be provided an organic light emitting display panel and an organic light emitting display device capable of preventing a reduction in the emission area due to the repair area by disposing the repair pattern disposed in the repair area to overlap the active layer and the first emission area.

According to embodiments of the disclosure, there may be provided an organic light emitting display panel and an organic light emitting display device capable of minimizing damage due to etching while simplifying the process by including the active layer in the electrode included in the emission area and the repair pattern.

According to embodiments of the disclosure, there may be provided an organic light emitting display panel and an organic light emitting display device capable of adjusting the color coordinates of each emission area while enhancing the luminance of the rear emission area as well as the front emission area.

BRIEF DESCRIPTION OF DRAWINGS

The above and other objects, features, and advantages of the disclosure will be more clearly understood from the following detailed description, taken in conjunction with the accompanying drawings, in which:

FIG. 7 is a cross-sectional view including an area taken along E-F and G-H of FIG. 6 according to embodiments of the disclosure;

DETAILED DESCRIPTION

Figure 1:
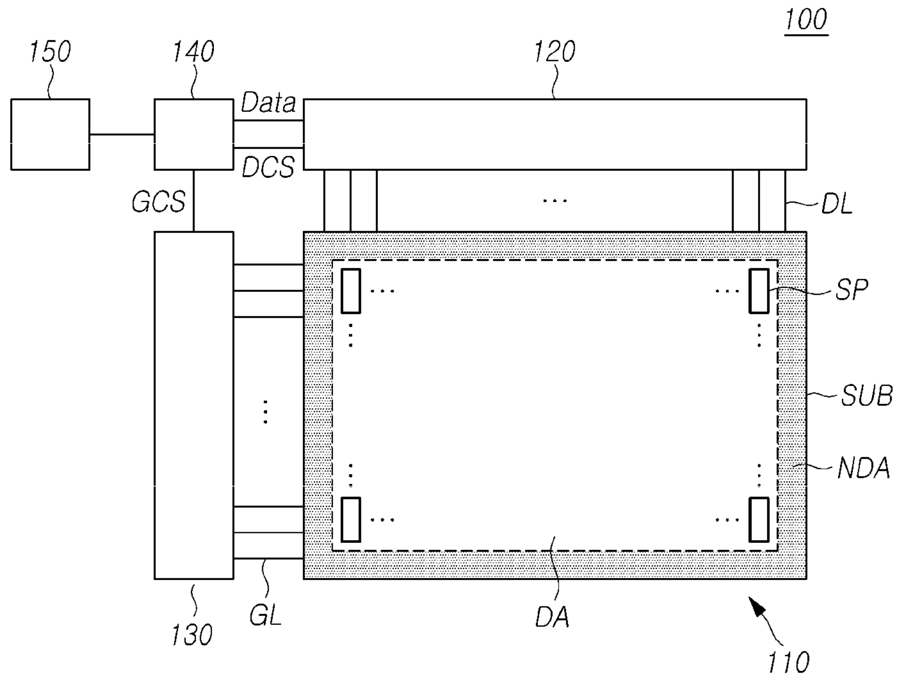
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” may be used herein to describe elements of the disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element may be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms may be used to describe non-consecutive or non-sequential processes or operations unless the term “directly” or “immediately” is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term “may” fully encompasses all the meanings of the term “can”.

Hereinafter, various embodiments of the disclosure are described in detail with reference to the accompanying drawings.

FIG. 1 is a view illustrating a system configuration of a display device according to embodiments of the disclosure. Referring to FIG. 1, a display driving system of a display device 100 according to embodiments of the disclosure may include a display panel 110 and display driving circuits for driving the display panel 110.

The display panel 110 may include a display area DA in which images are displayed and a non-display area NDA in which no image is displayed. The display panel 110 may include a plurality of subpixels SP disposed on a substrate SUB for image display. For example, the plurality of subpixels SP may be disposed in the display area DA. In some cases, at least one subpixel SP may be disposed in the non-display area NDA. At least one subpixel SP disposed in the non-display area NDA is also referred to as a dummy subpixel.

The display panel 110 may include a plurality of signal lines disposed on the substrate SUB to drive the plurality of subpixels SP. For example, the plurality of signal lines may include data lines DL, gate lines GL, driving voltage lines, and the like.

The plurality of data lines DL and the plurality of gate lines GL may cross each other. Each of the plurality of data lines DL may be disposed while extending in a first direction. Each of the plurality of gate lines GL may be disposed while extending in a direction crossing the first direction. Here, the first direction may be a column direction and the direction crossing the first direction may be a row direction.

The display driving circuits may include a data driving circuit 120, a gate driving circuit 130, and a controller 140 controlling the data driving circuit 120 and the gate driving circuit 130. The data driving circuit 120 may output data signals (also referred to as data voltages) corresponding to an image signal to the plurality of data lines DL. The gate driving circuit 130 may generate gate signals and output the gate signals to the plurality of gate lines GL. The controller 140 may convert the input image data input from an external host 150 to meet the data signal format used in the data driving circuit 120 and supply the converted image data to the data driving circuit 120.

The data driving circuit 120 may include one or more source driver integrated circuits. For example, each source driver integrated circuit may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may be connected to the display panel 110 by a tape automatic bonding (TAB) method, connected to a bonding pad of the display panel 110 by a COG or COP method, connected to the display panel 110 by a COF method, or may be formed in the non-display area NDA of the display panel 110 by a gate in panel (GIP) method.

The display device 100 according to embodiments of the disclosure may be a self-emission display device in which the display panel 110 emits light by itself. For example, the display device 100 according to embodiments of the disclosure may be an organic light emitting diode display in which the light emitting element is implemented as an organic light emitting diode (OLED). As another example, the display device 100 according to embodiments of the disclosure may be an inorganic light emitting display device in which the light emitting element is implemented as an inorganic material-based light emitting diode. As another example, the display device 100 according to embodiments of the disclosure may be a quantum dot display device in which the light emitting element is implemented as a quantum dot which is self-emission semiconductor crystal.

Figure 2:
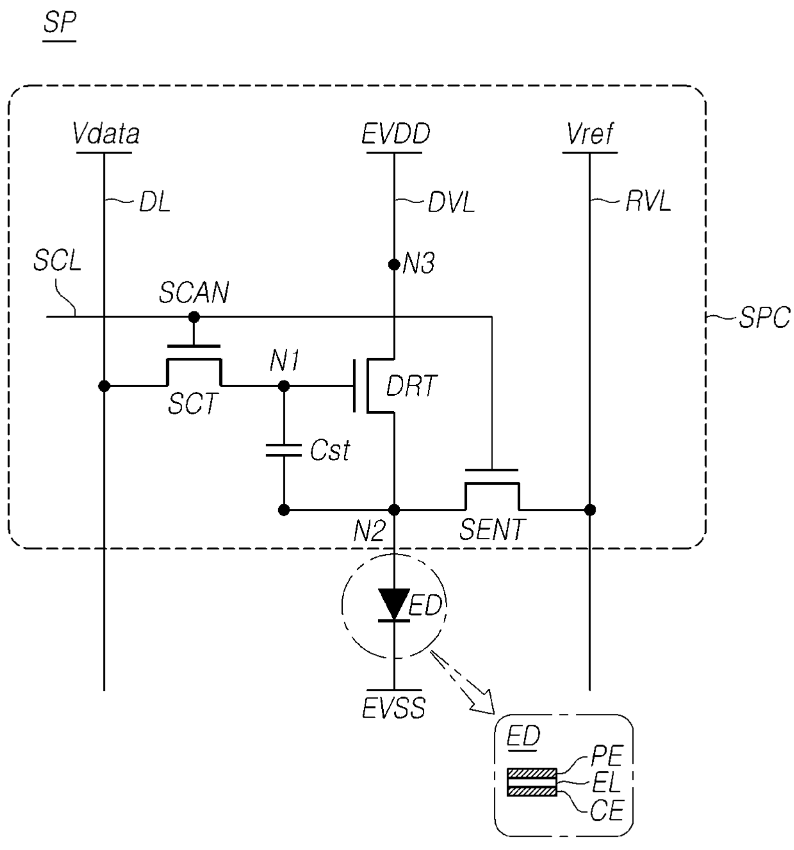
FIG. 2 is an equivalent circuit diagram illustrating a subpixel of a display device according to embodiments of the disclosure.

FIG. 2 is an equivalent circuit diagram illustrating a subpixel SP of a display device 100 according to embodiments of the disclosure. Referring to FIG. 2, in the display device 100 according to embodiments of the disclosure, each subpixel SP may include a light emitting element ED and a pixel driving circuit SPC for driving the light emitting element ED. The pixel driving circuit SPC may include a driving transistor DRT, a scan transistor SCT, and a storage capacitor Cst.

The driving transistor DRT may control a current flowing to the light emitting element ED to drive the light emitting element ED. The scan transistor SCT may transfer the data voltage Vdata to the first node N1 which is the gate node of the driving transistor DRT. The storage capacitor Cst may be configured to maintain a voltage for a predetermined period of time.

The light emitting element ED may include a pixel electrode PE and a common electrode CE, and a light emitting layer EL positioned between the pixel electrode PE and the common electrode CE. The pixel electrode PE may be an anode electrode (or a cathode electrode) and may be electrically connected to the second node N2 of the driving transistor DRT. The common electrode CE may be a cathode electrode (or an anode electrode), and a ground voltage EVSS may be applied thereto. The light emitting element ED may be an organic light emitting diode OLED, an inorganic material-based light emitting diode LED, or a quantum dot light emitting element, for example.

The driving transistor DRT is a transistor for driving the light emitting element ED, and may include a first node N1, a second node N2, and a third node N3. The first node N1 is a gate node and may be electrically connected to the source node or drain node of the scan transistor SCT. The second node N2 may be a source node or a drain node, and may be electrically connected to the pixel electrode PE of the light emitting element ED. The third node N3 may be a drain node or a source node, and may be electrically connected to a driving voltage line DVL that supplies the driving voltage EVDD. For convenience of description, in the example described below, the second node N2 may be a source node and the third node N3 may be a drain node.

The scan transistor SCT may switch the connection between the data line DL and the first node N1 of the driving transistor DRT. In response to the scan signal SCAN supplied from the scan line SCL which is a kind of the gate line GL, the scan transistor SCT may control connection between the first node N1 of the driving transistor DRT and a corresponding data line DL among the plurality of data lines DL.

The drain node or source node of the scan transistor SCT may be electrically connected to a corresponding data line DL. The source node or drain node of the scan transistor SCT may be electrically connected to the first node N1 of the driving transistor DRT. The gate node of the scan transistor SCT may be electrically connected to the scan line SCL to receive the scan signal SCAN. The scan transistor SCT may be turned on by the scan signal SCAN of a turn-on level voltage and transfer the data voltage Vdata supplied from the data line DL to the first node N1 of the driving transistor DRT.

The storage capacitor Cst may be configured between the first node N1 and second node N2 of the driving transistor DRT.

Referring to FIG. 2, in the display device 100 according to embodiments of the disclosure, the pixel driving circuit SPC of each subpixel SP may further include a sensing transistor SENT. The sensing transistor SENT may switch the connection between the second node N2 of the driving transistor DRT and the reference voltage line RVL to which the reference voltage Vref is applied.

In response to the scan signal SCAN supplied from the scan line SCL, the sensing transistor SENT may control connection between the second node N2 of the driving transistor DRT electrically connected to the pixel electrode PE of the light emitting element ED and a corresponding reference voltage line RVL among the plurality of reference voltage lines RVL. In FIG. 2, the gate node of the sensing transistor SENT and the gate node of the scan transistor SCT are connected to the same scan line SCL, but this is merely an example for convenience of description, and they may be connected to different scan lines SCL.

The drain node or source node of the sensing transistor SENT may be electrically connected to the reference voltage line RVL. The source node or drain node of the sensing transistor SENT may be electrically connected to the second node N2 of the driving transistor DRT and may be electrically connected to the pixel electrode PE of the light emitting element ED. The gate node of the sensing transistor SENT may be electrically connected to the scan line SCL to receive the scan signal SCAN.

Each of the driving transistor DRT, the scan transistor SCT, and the sensing transistor SENT may be an n-type transistor or a p-type transistor.

The 3T1C structure of the subpixel SP illustrated in FIG. 2 is merely an example for description purposes, and the subpixel SP may include only two transistors and one capacitor or may further include one or more transistors, or further include one or more capacitors. The plurality of subpixels SP may have the same structure, or some of the plurality of subpixels SP may have a different structure.

Figure 3:
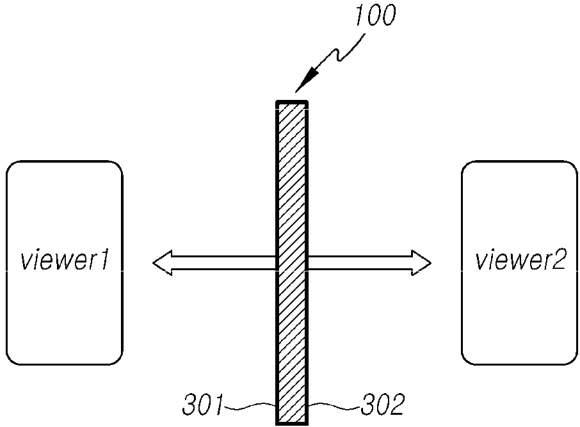
FIG. 3 is a view schematically illustrating a portion of a viewable area of a display panel according to embodiments of the disclosure.

FIG. 3 is a view schematically illustrating a portion of a viewable area of a display panel according to embodiments of the disclosure.

Referring to FIG. 3, the display panel 110 of the display device according to embodiments of the disclosure may be viewable on the front surface 301 and the rear surface 302 of the display panel 110 in at least some areas.

For example, as illustrated in FIG. 3, an area that may be viewed on the front surface 301 of the display panel 110 may also be viewed on the rear surface 302 of the display panel 110. Accordingly, viewers 1 and 2 positioned opposite to each other with respect to the display panel 110 may watch an image implemented from one display panel 110.

Further, the display panel 110 according to embodiments of the disclosure may include an area that may be viewed only on the front surface 301 and an area that may be viewed only on the rear surface 302.

Next, the structure of the display device according to embodiments of the disclosure will be described with reference to FIGS. 4A and 4B as follows.

Figure 4A:
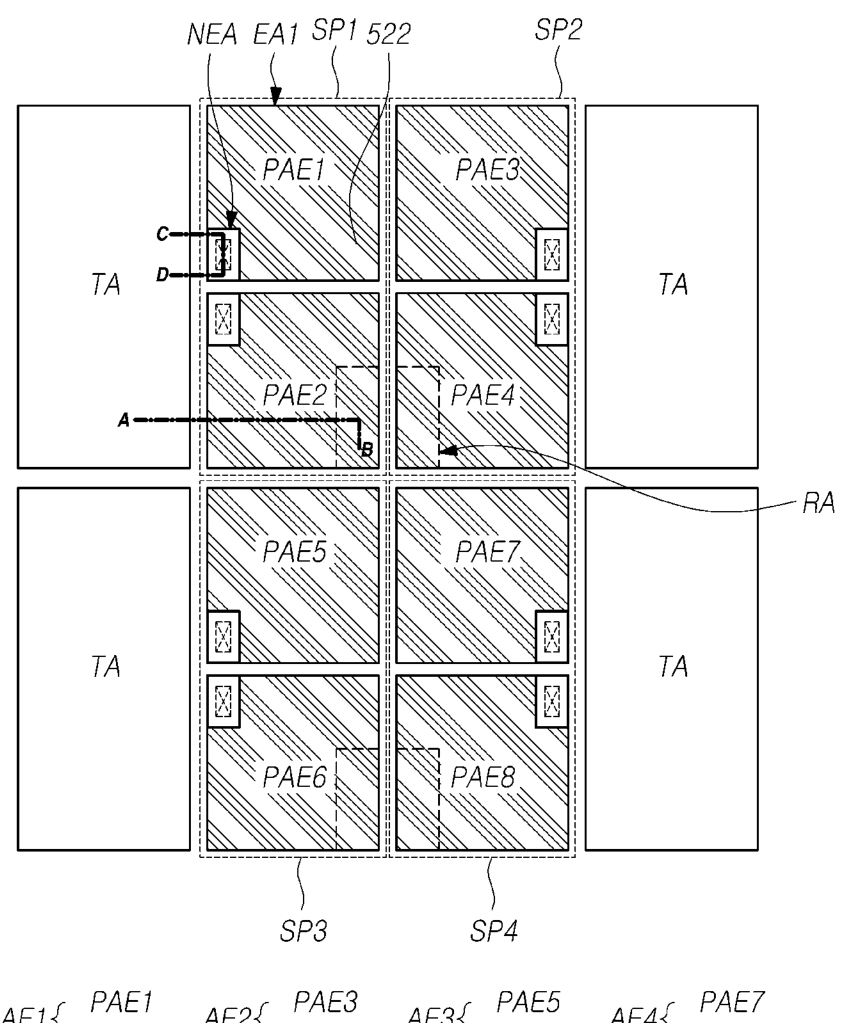
FIGS. 4A and 4B are views schematically illustrating a planar structure of a display device according to embodiments of the disclosure.
Figure 4B:
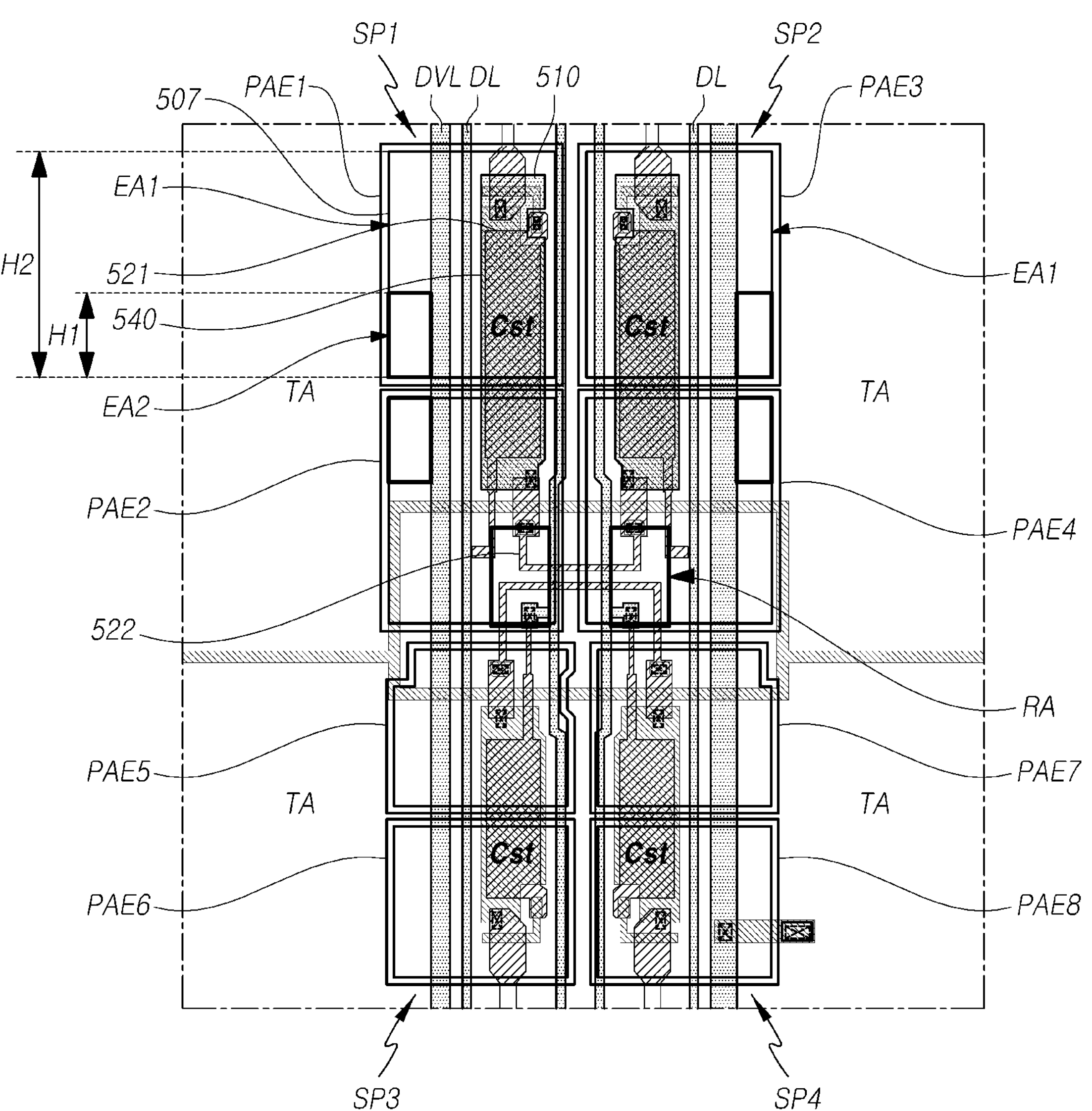

FIGS. 4A and 4B are views schematically illustrating a planar structure of a display device according to embodiments of the disclosure.

Referring to FIGS. 4A and 4B, the display device 100 according to embodiments of the disclosure may be a transparent display. The display device 100 according to embodiments of the disclosure may include a transmissive area TA and a non-transmissive area. The non-transmissive area may be an area where the subpixels SP1, SP2, SP3, and SP4 are disposed, an emission area of the subpixels SP1, SP2, SP3, and SP4, or an area where the pixel driving circuits SPC of the subpixels SP1, SP2, SP3, and SP4 are disposed. The transmissive area may have a transmittance larger than or equal to a predetermined threshold transmittance, and may also be referred to as a transparent area.

Referring to FIGS. 4A and 4B, four subpixels SP1, SP2, SP3, and SP4 may be disposed in two columns, and transmissive areas TA may be disposed on two opposite sides of the four subpixels SP1, SP2, SP3, and SP4, for example. The transmissive area TA may be disposed in a non-emission area.

Referring to FIGS. 4A and 4B, an anode electrode AE may be disposed in each of the four subpixels SP1, SP2, SP3, and SP4, and the anode electrode AE may include at least two partial electrode parts.

For example, a first anode electrode AE1 of a first subpixel SP1 may include a first partial electrode part PAE1 and a second partial electrode part PAE2.

A second anode electrode AE2 of a second subpixel SP2 may include a third partial electrode part PAE3 and a fourth partial electrode part PAE4.

A third anode electrode AE3 of a third subpixel SP3 may include a fifth partial electrode part PAE5 and a sixth partial electrode part PAE6.

A fourth anode electrode AE4 of a fourth subpixel SP4 may include a seventh partial electrode part PAE7 and an eighth partial electrode part PAE8.

In the display device according to embodiments of the disclosure, at least one subpixel may include at least two emission areas EA1 and EA2.

For example, the at least one subpixel may include a first emission area EA1 and a second emission area EA2.

At least a portion of the first emission area EA1 and at least a portion of the second emission area EA2 may overlap each other, but the arrangement relationship of the emission area of the display device according to embodiments of the disclosure is not limited thereto, and the first emission area EA1 and the second emission area EA2 may not overlap each other.

For example, the first emission area EA1 may be an area where light emitted from the light emitting element ED is emitted toward the front surface of the display panel, and the second emission area EA2 may be an area where light emitted from the light emitting element ED is emitted toward the rear surface of the display panel or is emitted toward the front surface and the rear surface (both directions).

Referring to FIG. 4B, the second emission area EA2 may be disposed on at least one side of the data line DL.

For example, as illustrated in FIG. 4B, the second emission area EA2 may be disposed on one side of the data line DL and the driving voltage line DVL. Here, the data line DL and the driving voltage line DVL may be disposed adjacent to each other.

Further, the second emission area EA2 may be disposed on one side of the data line DL and the reference voltage line RBL. Here, the data line DL and the reference voltage line RBL may be disposed adjacent to each other.

Also, referring to FIG. 4B, one data line DL and one driving voltage line DVL may be disposed between the second emission area EA2 and the storage capacitor Cst. Further, one data line DL and one reference voltage line RBL may be disposed between another second emission area EA2 and the storage capacitor Cst.

Referring to FIGS. 4A and 4B, a transmissive area TA may be disposed on one side of the second emission area EA2.

Referring to FIG. 4B, the second emission area EA2 may be disposed between the data line DL and the transmissive area TA.

At least one second emission area EA2 may be disposed between one driving voltage line DVL disposed on one side of the data line DL and one transmissive area TA. Further, at least one other second emission area EA2 may be disposed between one reference voltage line RBL disposed on one side of the data line DL and one transmissive area TA.

Referring to FIGS. 4A and 4B, the at least one second emission area EA2 may be disposed between the at least one partial electrode part PAE and the at least one transmissive area TA. In other words, the second emission area EA2 may be disposed to be spaced apart from the partial electrode part PAE, which is an anode electrode.

FIGS. 4A and 4B illustrate a configuration in which the length H1 of the at least one second emission area EA2 is shorter than the length H2 of the opening of the bank 507, but embodiments of the disclosure are not limited thereto.

For example, the length H1 of the second emission area EA2 may be the same as the length H2 of the opening of the bank 507.

Here, the length H2 of the opening of the second emission area EA2 and the bank 507 is a length with respect to the direction in which the data line DL extends.

As described above, since the second emission area EA2 is disposed so as not to invade the transmissive area TA, a display device having enhanced transmittance may be implemented.

Referring to FIGS. 4A and 4B, at least one subpixel may include at least one repair area RA.

Referring to FIGS. 4A and 4B, the first subpixel may include a repair area RA overlapping the first emission area EA1.

Since the repair area RA is disposed to overlap the first emission area EA1, the repair area RA may be provided without decreasing the aperture ratio.

The repair area RA may include at least one repair pattern 522, and partial electrode parts disposed in one subpixel may be electrically connected through the repair pattern 522, but embodiments of the disclosure are not limited thereto.

Referring to FIGS. 4A and 4B, a transmissive area TA may be positioned on one side surface of each of the first subpixel SP1, the second subpixel SP2, the third subpixel SP3, and the fourth subpixel SP4.

As illustrated in FIGS. 4A and 4B, the first and second emission areas EA1 and EA2 and the repair area RA included in the first to fourth subpixels SP1, SP2, SP3, and SP4 may not overlap the transmissive area TA, thereby increasing the area of the transmissive area TA.

Figure 5:
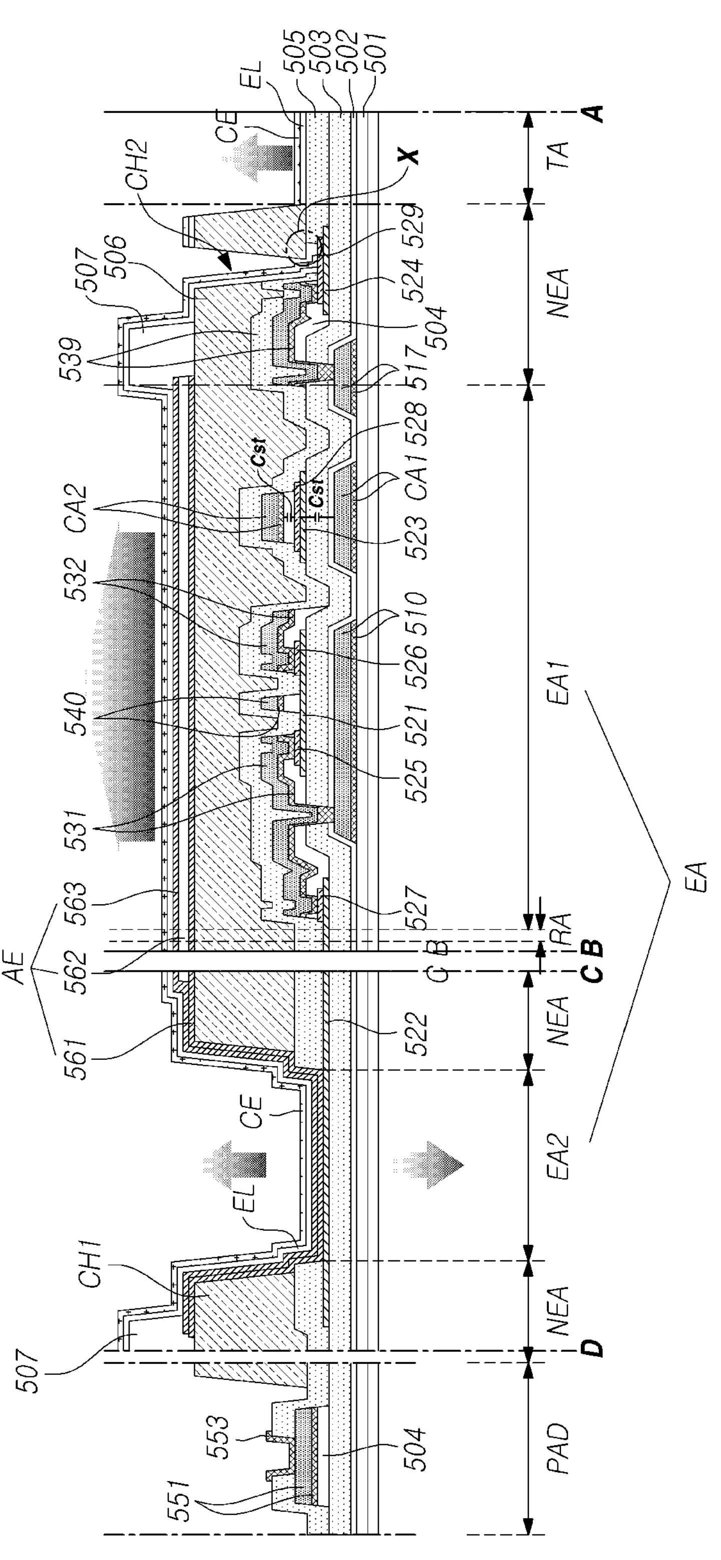
FIG. 5 is a cross-sectional view including an area taken along A-B of FIG. 4A according to embodiments of the disclosure.

Referring to FIG. 5, a structure in which the first emission area EA1 and the second emission area EA2 overlap each other in one subpixel is described below.

FIG. 5 is a cross-sectional view including an area taken along A-B of FIG. 4A according to one embodiment.

Referring to FIG. 5, a display device according to embodiments of the disclosure includes a first emission area EA1, a second emission area EA2, a non-emission area NEA, a repair area RA, and a transmissive area TA.

Referring to FIG. 5, the emission area EA may include a first emission area EA1 and a second emission area EA2. The first emission area EA1 may also overlap the repair area RA.

The second emission area EA2 may not overlap the repair area RA in one embodiment.

The light emitting element ED and at least one transistor driving the light emitting element ED may be disposed in the first emission area EA1.

The light emitting element ED may be disposed in the second emission area EA2, and a separate transistor may not be disposed. The light emitting element ED disposed in the second emission area EA2 may be driven through the transistor disposed in the first emission area EA1.

In the repair area RA, a repair pattern 522 (or a second active layer) capable of repairing a corresponding subpixel when the corresponding subpixel is defective may be disposed.

The first substrate 501 may be disposed in the transmissive area TA, and in some cases, at least one layer of insulation films 502, 504, and 505 may be disposed, and the light emitting layer EL and the cathode electrode CE of the light emitting element ED may be disposed. At least one pad electrode 551 or 553 may be disposed in the pad area PAD.

Specifically, a plurality of conductive layers 510, CA1, and 517 may be disposed on the first substrate 501.

The plurality of conductive layers 510, CA1, and 517 may be formed of a single layer or a multilayer structure.

Each of the plurality of conductive layers 510, CA1, and 517 may include any one of metals such as aluminum (Al), gold (Au), silver (Ag), copper (Cu), tungsten (W), molybdenum (Mo), chromium (Cr), tantalum (Ta), titanium (Ti), or an alloy thereof, but embodiments of the disclosure are not limited thereto.

Element 510 (hereinafter, referred to as a first conductive layer) may be a light blocking layer and a conductive layer to which a data voltage is applied, CA1 may be an electrode of a storage capacitor (hereinafter, referred to as a first storage capacitor electrode), and 517 (hereinafter, referred to as a second conductive layer) may be a conductive layer to which a cathode voltage is applied.

A first insulation film 502 and a second insulation film 503 may be disposed on the plurality of conductive layers 510, CA1, and 517.

A plurality of active layers 521, 522, 523, and 524 may be disposed on the second insulation film 503.

The plurality of active layers 521, 522, 523, and 524 may include a first active layer 521, a second active layer 522, a third active layer 523, and a fourth active layer 524. The first to fourth active layers 521, 522, 523, and 524 may be disposed on the same layer.

Some of the plurality of active layers 521, 522, 523, and 524 may be integrally formed on a flat surface, but embodiments of the disclosure are not limited thereto.

The plurality of active layers 521, 522, 523, and 524 may be formed of an oxide semiconductor or the like. When the plurality of active layers 521, 522, 523, and 524 are oxide semiconductors, the plurality of active layers 521, 522, 523, and 524 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), but the active layers 521, 522, 523, and 524 according to embodiments of the disclosure are not limited thereto.

FIG. 5 illustrates a structure in which a plurality of active layers 521, 522, 523, and 524 are a single layer, but embodiments of the disclosure are not limited thereto, and may be a multilayer structure having two or more layers.

The first active layer 521 may be an active layer 521 included in a transistor required to drive the light emitting element ED. The first active layer 521 may be disposed in an area corresponding to the first emission area EA1.

The second active layer 522 may be a repair pattern disposed in the repair area RA. The second active layer 5220 may be disposed in a portion of the first emission area EA1, the repair area RA, the second emission area EA2, and a portion of the non-emission area NEA.

As the second active layer 522 serves as a repair pattern, the repair may be performed using a laser beam having a shorter wavelength than the repair pattern using the metal layer in the repair process.

Accordingly, since the power of the laser beam used during the process is reduced, it is possible to prevent or at least reduce damage from occurring in other components due to the laser beam and eliminate the need for a separate margin area considering the damage. Accordingly, since the margin area may be utilized as an emission area, the aperture ratio may be enhanced.

The third active layer 523 may be disposed on the first storage capacitor electrode CA1 to overlap the first storage capacitor electrode CA1.

The fourth active layer 524 may be disposed in the non-emission area NEA.

A plurality of metal layers 525, 526, 527, 528, and 529 including at least one layer may be disposed on at least one active layer among the first to fourth active layers 521, 522, 523, and 524.

The metal layers 525, 526, 527, 528, and 529 may include any one of metals such as aluminum (Al), gold (Au), silver (Ag), copper (Cu), tungsten (W), molybdenum (Mo), chromium (Cr), tantalum (Ta), titanium (Ti), or an alloy thereof. For example, the metal layer 350 may be an alloy of molybdenum (Mo) and titanium (Ti), but the disclosure are not limited thereto.

Each of the metal layers 525, 526, 527, 528, and 529 may overlap a portion of the upper surface of one active layer in one embodiment.

For example, a first metal layer 525 and a second metal layer 526 may be disposed on the first active layer 521.

A third metal layer 527 may be disposed on the second active layer 522.

A fourth metal layer 528 may be disposed on the third active layer 523.

A fifth metal layer 529 may be disposed on the fourth active layer 524.

An area where each of the first to fourth active layers 521, 522, 523, and 524 overlaps the metal layers 525, 526, 527, 528, and 529 may be a non-conductive area, and an area where each of the first to fourth active layers 521, 522, 523, and 524 does not overlap the metal layers 525, 526, 527, 528, and 529 may be a conductive area.

A gate insulation film 504 may be disposed on the first substrate 501 on which the first to fourth active layers 521, 522, 523, and 524 and the metal layers 525, 526, 527, 528, and 529 are disposed.

The gate insulation film 504 may be disposed to overlap a portion of the upper surface of the first active layer 521, a portion of the upper surface of the second active layer 522, a portion of the upper surface of the third active layer 523, and a portion of the upper surface of the fourth active layer 524.

A plurality of electrodes may be disposed on the gate insulation film 504.

Specifically, the gate electrode 540 of the transistor may be disposed to overlap the first active layer 521. An area where the first active layer 521 overlaps the gate electrode 540 may be a channel area of the first active layer 521.

Further, the source electrode 531 and the drain electrode 532 of the transistor may be disposed on the gate insulation film 504. In FIG. 5, a configuration in which 531 is the source electrode and 532 is the drain electrode has been mainly described, but embodiments of the disclosure are not limited thereto, and 532 may be the source electrode and 531 may be the drain electrode.

The source electrode 531 may contact the first metal layer 525 disposed on the first active layer 521 through a contact hole formed in the gate insulation film 504, and the drain electrode 532 may contact the second metal layer 526 disposed on the first active layer 521 through a contact hole formed in the gate insulation film 504.

Referring to FIG. 5, the source electrode 531 may contact the first conductive layer 510 through a contact hole formed in the gate insulation film 504 and the first and second insulation films 502 and 503.

Further, the source electrode 531 may contact the third metal layer 527 disposed on the second active layer 522.

Accordingly, the signal applied to the source electrode 531 through the first conductive layer 510 may be transmitted to the third conductive layer 527 and the second active layer 522.

The second storage capacitor electrode CA2 and the third conductive layer 539 may be disposed on the same layer as the gate electrode 540, the source electrode 531, and the drain electrode 532.

The second storage capacitor electrode CA2 may overlap the third active layer 523 and the fourth metal layer 539 to form the storage capacitor Cst. Accordingly, the first storage capacitor electrode CA1, the fourth metal layer 539, and the second storage capacitor electrode CA2 may overlap each other to form a double storage capacitor.

The third conductive layer 539 may contact the second conductive layer 517 through contact holes provided in the first and second insulation films 502 and 503. Further, the third conductive layer 539 may contact the fifth metal layer 529 disposed on the second insulation film 503.

The source electrode 531, the drain electrode 532, the gate electrode 540, the second storage capacitor CA2, and the third conductive layer 539 may be formed of a single layer or may be formed of a multilayer structure of two or more layers.

Each of the source electrode 531, the drain electrode 532, the gate electrode 540, the second storage capacitor CA2, and the third conductive layer 539 may include any one of metals such as aluminum (Al), gold (Au), silver (Ag), copper (Cu), tungsten (W), molybdenum (Mo), chromium (Cr), tantalum (Ta), titanium (Ti), or an alloy thereof, but embodiments of the disclosure are not limited thereto.

The first pad electrode 551 disposed in the pad area PAD may be disposed on the same layer as the source electrode 531, the drain electrode 532, the gate electrode 540, the second storage capacitor CA2, and the third conductive layer 539.

A third insulation film 505 may be disposed on the source electrode 531, the drain electrode 532, the gate electrode 540, the second storage capacitor CA2, the third conductive layer 539, and the first pad electrode 551.

The second pad electrode 553 may be disposed on the third insulation film 505 in the pad area PAD, and the second pad electrode 553 may contact the first pad electrode 551 through a contact hole provided in the third insulation film 505.

A fourth insulation film 506 may be disposed on the third insulation film 505 in the display area other than the pad area PAD.

The first to third insulation films 502, 503, and 505 may include an inorganic insulating material, and the fourth insulation film 506 may include an organic insulating material, but embodiments of the disclosure are not limited thereto.

The anode electrode AE of the light emitting element ED may be disposed on the fourth insulation film 506.

The anode electrode AE may include a first electrode layer 561 disposed on the fourth insulation film 506, a second electrode layer 562 disposed on the first electrode layer 561, and a third electrode layer 563 disposed on the second electrode layer 562.

Here, the first electrode layer 561 and the third electrode layer 563 may include a transparent conductive material, e.g., at least one of indium tin oxide (ITO), indium zinc oxide (IZO), or indium gallium zinc oxide (IGZO), but the disclosure is not limited thereto.

The second electrode layer 562 may be a reflective electrode including a conductive material capable of reflecting light. For example, the second electrode layer 562 may include any one of metals such as aluminum (Al), gold (Au), silver (Ag), copper (Cu), tungsten (W), molybdenum (Mo), chromium (Cr), tantalum (Ta), titanium (Ti), or an alloy thereof, but the disclosure is not limited thereto.

The fourth insulation film 506 disposed under the anode electrode 360 may include a first contact hole CH1 and a second contact hole CH2.

In the area where the first contact hole CH1 of the fourth insulation film 506 is provided, a contact hole may also be provided in the insulation film (e.g., the third insulation film 505) disposed under the fourth insulation film 506.

In the area corresponding to the first contact hole CH1 of the fourth insulation film 506, a portion of the upper surface of the second active layer 522 may be exposed by the contact hole CH2 of the fourth insulation film 506 and the contact hole of the third insulation film 505.

The first electrode layer 561 and the third electrode layer 563 of the anode electrode AE may be disposed from the upper surface of the fourth insulation film 506 to the upper surface of the second active layer 522 overlapping the first contact hole CH1 of the fourth insulation film 506. In the first contact hole CH1 of the fourth insulation film 506, the upper surface of the second active layer 522 and the first electrode layer 561 may contact each other.

The second electrode layer 562 of the anode electrode AE may not be disposed in the first contact hole CH1 of the fourth insulation film 506. In other words, the second electrode layer 562 of the anode electrode AE may not overlap the first contact hole CH1 of the fourth insulation film 506.

A bank 507 may be disposed on a portion of the upper surface of the anode electrode AE and the fourth insulation film 506.

The light emitting layer EL and the cathode electrode CE of the light emitting element ED may be sequentially disposed on the bank 507 and the anode electrode AE.

In the display area DA, the area where the bank 507 is disposed may be the non-emission area NEA, and the area where the bank 507 is not disposed may be the emission area EA.

One emission area EA may include a first emission area EA1 and a second emission area EA2.

Referring to FIG. 5, the anode electrode AE of the light emitting element ED disposed in the first emission area EA1 may include a first electrode layer 561, a second electrode layer 562, and a third electrode layer 563. In the first emission area EA1, light emitted from the light emitting element ED may be emitted toward the common electrode CE of the light emitting element ED.

Referring to FIG. 5, the first emission area EA1 may include a repair area RA. In other words, the repair area RA may overlap the anode electrode AE and may not overlap the bank 507.

A second active layer 522 electrically connected to the source electrode 531 of the transistor through the third metal layer 527 may be disposed in the repair area RA.

When a defect occurs in the corresponding subpixel, the second active layer 522 may be cut using a laser beam or the like to break the electrical connection with the transistor.

Referring to FIG. 5, the emission area EA1 may include a second emission area EA2 adjacent to the repair area RA included in the first emission area EA1.

The anode electrode AE of the light emitting element EA disposed in the second emission area EA2 may include a first electrode layer 561 and a third electrode layer 563.

In other words, the second electrode layer 562 of the anode electrode AE may not be disposed in the second emission area EA2. In the second emission area EA2, a portion of the light emitted from the light emitting element ED may be emitted toward the second active layer 522, and another portion of the light emitted from the light emitting element ED may be emitted toward the cathode electrode CE.

Light may be emitted in one direction in the first emission area EA1, and light may be emitted in both directions in the second emission area EA2.

Accordingly, the display device according to embodiments of the disclosure may be viewable only on the front surface of the display panel in some areas, and viewable on both surfaces of the display panel in the remaining areas.

Further, the first electrode layer 561 and the third electrode layer 563 of the anode electrode AE disposed in one first emission area EA1 may extend to the second emission area EA2 through the repair area RA. Each of the light emitting layer EL and the cathode electrode CE may be disposed in the first and second emission areas EA1 and EA2 and the repair area RA.

In other words, one first emission area EA1 and one second emission area EA2 may be structured to share the first electrode layer 561, the third electrode layer 563, the light emitting layer EL, and the cathode electrode CE of the anode electrode AE.

As the first electrode layer 561 disposed in the second emission area EA2 is structured to contact the second active layer 522 electrically connected to the transistor disposed in the first emission area EA1, the light emitting element ED including the first electrode layer 561, the third electrode layer 563, the light emitting layer EL, and the cathode electrode AE of the anode electrode AE disposed in the second emission area EA2 may be driven through the transistor disposed in the first emission area EA1.

As described above, as the components of the light emitting elements ED disposed in each of the first and second emission areas EA1 and EA2 may be mutually shared, and the light emitting elements ED disposed in each of the emission areas EA1 and EA2 is driven through one transistor disposed in the first emission area EA1, the configuration and the process may be simplified.

Referring to FIG. 5, the fourth insulation film 506 may include a second contact hole CH2.

A contact hole may also be provided in an insulation film (e.g., the third insulation film 505) disposed under the fourth insulation film 506 in the area where the second contact hole CH1 of the fourth insulation film 506 is provided.

In an area corresponding to the second contact hole CH2 of the fourth insulation film 506, a portion of the upper surface of the fifth metal layer 529 disposed on the fourth active layer 524 may be exposed by the contact hole CH2 of the fourth insulation film 506 and the contact hole of the third insulation film 505.

Meanwhile, in the non-emission area NEA, the third insulation film 505 and the fourth insulation film 506 disposed on the fifth metal layer 529 may have an area X (hereinafter, referred to as the X area) disposed to have an eaves shape (undercut shape).

In the X area, the third insulation film 505 may be larger than the fourth insulation film 506 in the area overlapping the fifth metal layer 529.

Due to this structure, the light emitting layer EL deposited by a deposition method having strong straightness may be disposed only on a portion of the upper surface of the fifth metal layer 529 in the area where the second contact hole CH2 of the fourth insulation film 506 is positioned.

For example, the light emitting layer EL may not be disposed on the fifth metal layer 529 in the area overlapping the fourth insulation film 506 but not overlapping the third insulation film 505 in the X area. A cathode electrode CE of the light emitting element ED may be disposed on the fifth metal layer 529 on which the light emitting layer EL is not disposed. Accordingly, the fifth metal layer 529 and the cathode electrode CE may be electrically connected to each other.

Since the cathode electrode CE contacts the fifth metal layer 529, a voltage drop of the cathode electrode CE may be prevented.

As described above, the same light emitting layer EL and cathode electrode CE may be disposed in the first emission area EA1 and the second emission area EA2 included in one subpixel.

Referring to FIG. 5, a transmissive area TA may be disposed on one side of the emission area EA.

In the transmissive area TA, at least one insulation film (e.g., the first insulation film 502, the second insulation film 503, and the third insulation film 505) disposed on the first substrate 501 may be disposed, and the light emitting layer EL and the cathode electrode CE of the light emitting element ED may be disposed, but at least one layer may not be disposed.

Referring to FIG. 5, as the second active layer 522 is connected to the transistor disposed in the first emission area EA1 to supply power to the light emitting element of the second emission area EA2 while serving as a repair pattern, no separate repair pattern is required, and thus the area of the first hole CH1 of the fourth insulation film 506 and the hole of the third insulation film 505 corresponding to the second emission area EA2 may be increased.

Accordingly, the size of the second emission area EA2 may increase.

FIG. 5 illustrates a structure in which a viewer may view the front surface of the display panel in some areas and may view both surfaces of the display panel in the remaining areas, but the structure of embodiments of the disclosure is not limited thereto.

For example, the viewer may be able to view the front surface of the display panel in some areas, and may be able to view the rear surface of the display panel in the remaining areas.

This structure is described below with reference to FIG. 6.

Figure 6:
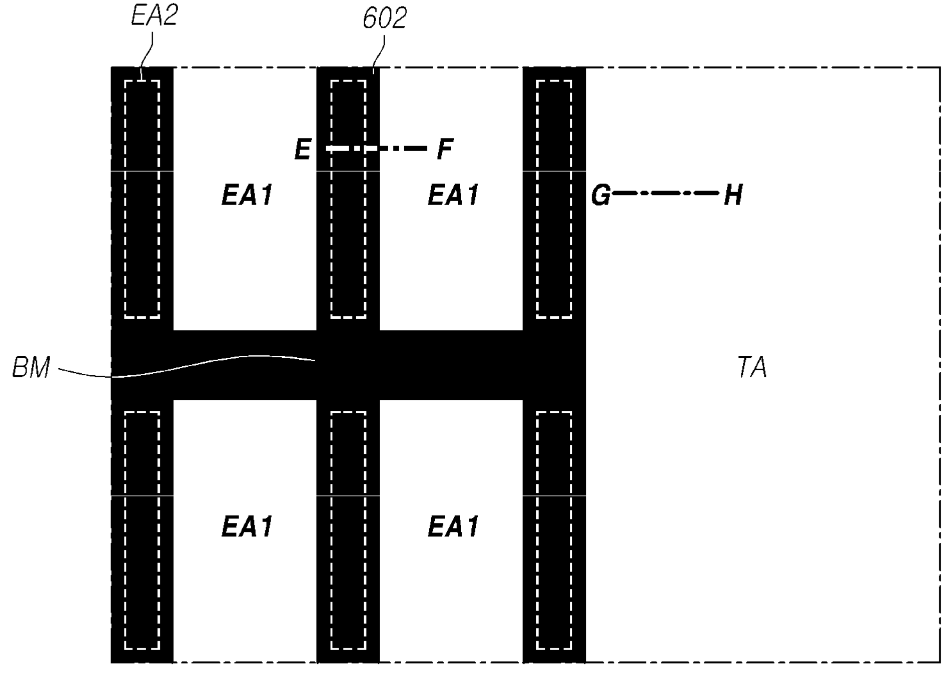
FIG. 6 is a plan view schematically illustrating a partial area of a display panel according to embodiments of the disclosure.

FIG. 6 is a plan view schematically illustrating a partial area of a display panel according to embodiments of the disclosure.

Referring to FIG. 6, a display panel according to an embodiment of the disclosure may include a first emission area EA1, a second emission area EA2, and a transmissive area TA.

The first emission area EA1 and the second emission area EA2 may not overlap each other.

The first emission area EA1 may be an area where light is emitted in the front direction of the display panel, and the second emission area EA2 may be an area where light is emitted in the rear direction of the display panel, but embodiments of the disclosure are not limited thereto, and any configuration is possible in which the direction of light emitted from the first emission area EA1 and the direction of light emitted from the second emission area EA2 are different.

In the plan view, the area of one first emission area EA1 may be larger than the area of the second emission area EA2.

The second emission area EA2 may be disposed to overlap the black matrix 602.

In the plan view, the black matrix 602 may be disposed in a mesh shape in the display area DA, and accordingly, the second emission area EA2 may also be disposed in a mesh shape.

The second emission area EA2 may be disposed to surround the first emission area EA1.

Further, the area of the second emission area EA2 may be smaller than the area of the black matrix 602.

As described above, as the first emission area EA1 and the second emission area EA2 do not overlap each other and the respective areas of the emission areas are configured to be different, the areas of emission from the front and rear surfaces of the display panel may be adjusted.

Referring to FIG. 6, a transmissive area TA may be disposed on one side of at least one emission area.

This structure is described below in detail with reference to FIG. 7.

Figure 7:
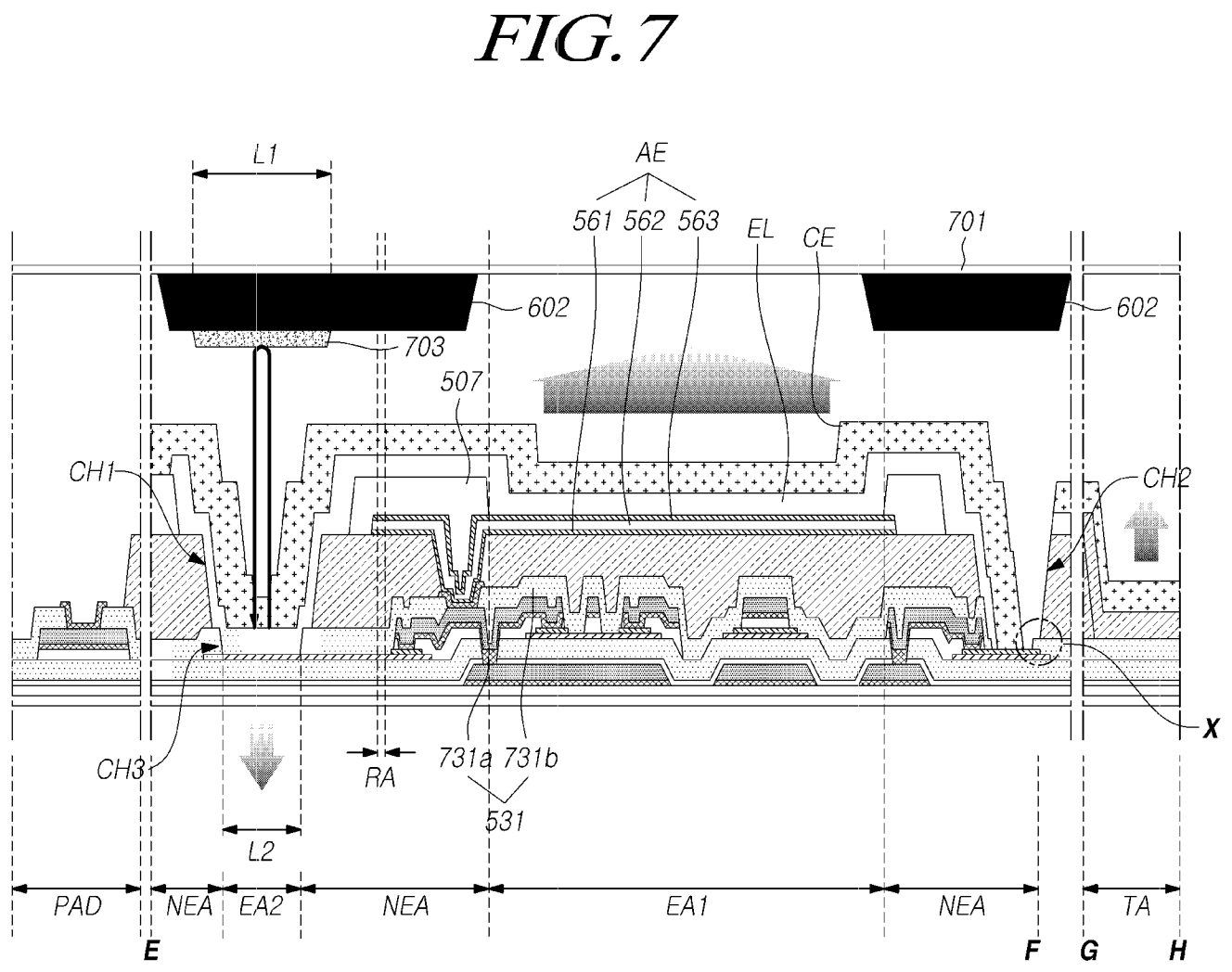

FIG. 7 is a cross-sectional view including an area taken along E-F and G-H of FIG. 6 according to one embodiment.

Referring to FIG. 7, in the display panel, one subpixel may include a first emission area EA1, a second emission area EA2, and a repair area RA. A non-emission area NEA may be disposed between the first emission area EA1 and the second emission area EA2. Further, the transmissive area TA may be disposed on at least one side of the non-emission area NEA.

The repair area RA in which the second active layer 522 is positioned as the repair pattern may be disposed in the non-emission area NEA, but the structure of the display panel according to embodiments of the disclosure is not limited thereto, and it may overlap the first emission area EA1 as illustrated in FIG. 5.

The plurality of conductive layers 510, CA1, and 517, the plurality of active layers 521, 522, 523, and 524, the plurality of metal layers 525, 526, 527, 528, and 529, the gate electrode 540, the source electrode 531, the drain electrode 532, the first pad electrode 551, the second pad electrode 553, the first insulation film 502, the second insulation film 503, the gate insulation film 504, the third insulation film 505, and the fourth insulation film 506 disposed on the first substrate 501 of FIG. 7 may be identical to the plurality of conductive layers 510, CA1, and 517, the plurality of active layers 521, 522, 523, and 524, the plurality of metal layers 525, 526, 527, 528, and 529, the gate electrode 540, the source electrode 531, the drain electrode 532, the first pad electrode 551, the second pad electrode 553, the first insulation film 502, the second insulation film 503, the gate insulation film 504, the third insulation film 505, and the fourth insulation film 506 described with reference to FIG. 5.

Referring to FIG. 7, the fourth insulation film 506 may include a first contact hole CH1 overlapping a portion of the upper surface of the second active layer 522, and the third insulation film 505 may also include a contact hole in the area where the first contact hole CH1 is positioned.

Accordingly, a portion of the upper surface of the second active layer 522 may be exposed by the third insulation film 505 and the fourth insulation film 506.

The fourth insulation film 506 may include a second contact hole overlapping a portion of the upper surface of the fifth metal layer 529, and the third insulation film 505 may also include a contact hole in the area where the second contact hole CH2 is positioned.

In the non-emission area NEA surrounding the first emission area EA1, the third insulation film 505 and the fourth insulation film 506 disposed on the fifth metal layer 529 may have an X area disposed to have an eaves shape.

Referring to FIG. 7, the anode electrode AE of the light emitting element ED may be disposed on the fourth insulation film 506. The anode electrode AE may include a first electrode layer 561, a second electrode layer 562, and a third electrode layer 563.

The first electrode 560 may be disposed in an area corresponding to the first emission area EA1 and the non-emission area NEA surrounding the first emission area EA2.

A bank 507 may be disposed on a portion of the upper surface of the first electrode 560 and the fourth insulation film 506.

The light emitting layer EL and the cathode electrode CE of the light emitting element ED may be disposed on the first substrate 501 on which the bank 507 is disposed. The light emitting layer EL and the cathode electrode CE may be disposed in the first emission area EA1, the non-emission area NEA surrounding the first emission area EA1, and the second emission area EA2 of the display area DA.

Specifically, the light emitting layer EL and the cathode electrode CE may be disposed on the upper surface of the first electrode 560, the upper surface of the bank 507, and in the first contact hole CH1 and the second contact hole CH2 of the fourth insulation film 506.

The third insulation film 506 may include a third contact hole CH3 overlapping the first contact hole CH1 of the fourth insulation film 506. The area of the third contact hole CH3 may be different from the area of the first contact hole CH1, but embodiments of the disclosure are not limited thereto, and the area of the first contact hole CH1 and the area of the third contact hole CH3 may be the same.

Accordingly, the light emitting layer EL may contact the upper surface of the second active layer 522 in the area corresponding to the first contact hole CH1 of the fourth insulation film 506. Further, the light emitting layer EL may contact a portion of the upper surface of the fifth metal layer 529 in the area corresponding to the second contact hole CH1 of the fourth insulation film 506.

The cathode electrode CE of the light emitting element ED may be disposed on the light emitting layer EL.

The area where the light emitting layer EL contacts the upper surface of the second active layer 522 may be the second emission area EA2. The area of the second emission area E2 may be the same as the area of the third contact hole CH3, but embodiments of the disclosure are not limited thereto, and the area of the third contact hole CH2 and the area of the second emission area EA2 may be different.

Here, the second active layer 522 may serve as the anode electrode of the light emitting element ED disposed in the second emission area EA2.

Accordingly, since it is not necessary to separately form the anode electrode of the light emitting element disposed in the second emission area EA2, the process of forming the light emitting element disposed in the second emission area EA1 may be simplified, and damage due to the etching process during the manufacturing process may be prevented.

The second active layer 522 may be electrically connected to the source electrode 531 of the transistor disposed in the first emission area EA1 through the third metal layer 527. Further, the source electrode 531 may be electrically connected to the anode electrode AE of the light emitting element ED disposed in the first emission area EA1.

Referring to FIG. 7, the rear surface of the source electrode 531 of the transistor disposed in the first emission area EA1 may contact the third metal layer 527, and the upper surface of the source electrode 531 may contact the anode electrode AE.

For example, referring to FIG. 7, the source electrode 531 may include a first layer 731*a* disposed on the gate insulation film 504 and a second layer 731*b* disposed on the first layer 731*a*. One surface of the first layer 731*a* may contact the third metal layer 527, and one surface of the second layer 731*b* may contact the anode electrode AE.

Accordingly, the light emitting element ED disposed in the first emission area EA1 and the light emitting element ED disposed in the second emission area EA2 may be driven through the transistor disposed in the first emission area EA1. In other words, no separate transistor for driving the light emitting element ED disposed in the second emission area EA2 may be required.

The display panel according to embodiments of the disclosure may include a second substrate 701 facing the first substrate 501 on which the transistor and the light emitting element ED are disposed.

The black matrix 602 may be disposed on one surface of the second substrate 701, and the reflective member 703 may be disposed on one surface of the black matrix 602.

Referring to FIG. 7, the black matrix 602 may be disposed in at least a portion of the non-emission area NEA of the display area DA and the second emission area EA2.

Further, the reflective member 703 overlapping the second emission area EA2 may be disposed on the black matrix 602.

In the cross-sectional view, the width L1 of the reflective member 703 may be larger than or equal to the width L2 of the second emission area EA2. The width L1 of the reflective member 703 and the width L2 of the second emission area EA2 may be minimum lengths with respect to a direction perpendicular to a direction in which the first insulating film 501 is stacked on the first substrate 501.

Some of the light emitted from the light emitting elements 522, EL, and CE disposed in the second emission area EA2 may be emitted in the direction of the first substrate 501 and finally emitted in the direction of the first substrate 501.

Further, another portion of the light emitted from the light emitting elements 522, EL, and CE disposed in the second emission area EA2 may have a path toward the second substrate 701, but may be reflected by the reflective member 703 disposed on one surface of the second substrate 701 so that the path is changed toward the first substrate 501 and the light may finally be extracted to the outside of the first substrate 501.

A portion of the light emitted from the light emitting elements AE, EL, and CE disposed in the first emission area EA1 may be emitted toward the second substrate 701 and be finally extracted to the outside of the second substrate 701.

Further, another portion of the light emitted from the light emitting elements AE, EL, and CE disposed in the first emission area EA1 may have a path toward the first substrate 501, but may be reflected by the second electrode layer 562 of the anode electrode AE, so that the path may be changed toward the second substrate 701 and the light may finally be extracted to the outside of the second substrate 701.

As the reflective member 703 is disposed in the second emission area EA2, a portion of the light of the light emitting element disposed in the second emission area EA2 (light directed toward the second substrate) may be extracted out of the first substrate 501 without being absorbed by the black matrix 602 disposed in the second emission area EA2. In other words, the luminance of the second emission area EA2 may be enhanced.

An image may be displayed on the front surface of the display panel through the light emitted from the first emission area EA1, and an image may also be displayed on the rear surface of the display panel through the light emitted from the second emission area EA2.

Meanwhile, the structure of the display panel according to embodiments of the disclosure is not limited thereto, and a color filter may be further included to adjust the color coordinates of each emission area.

This is discussed below with reference to FIGS. 8 and 9.

Figure 8:
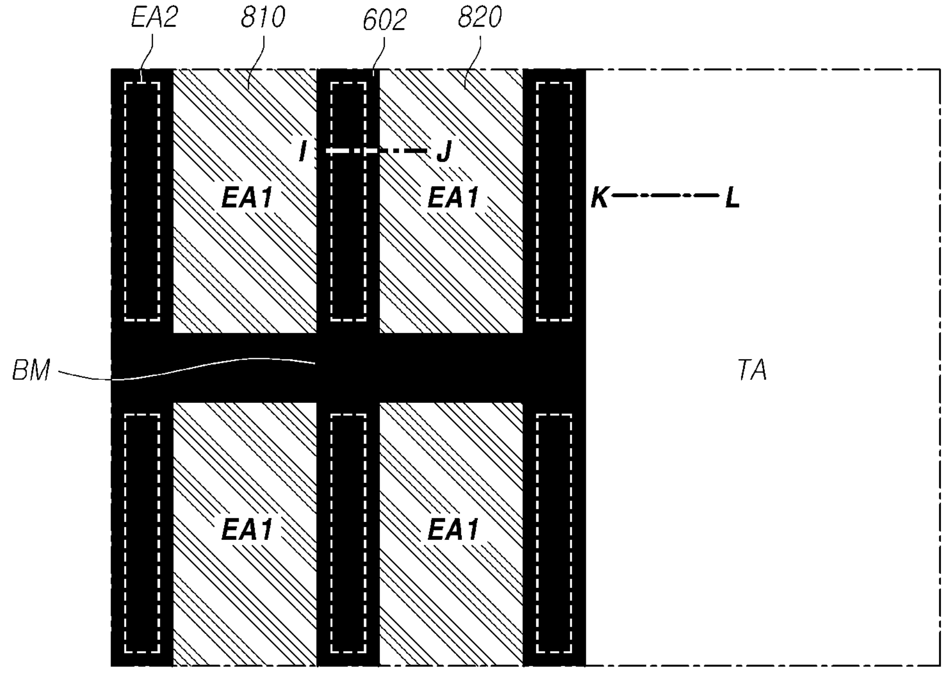
FIGS. 8 and 9 are views illustrating a partial area of a display panel where a color filter is disposed in a display area according to embodiments of the disclosure.
Figure 9:
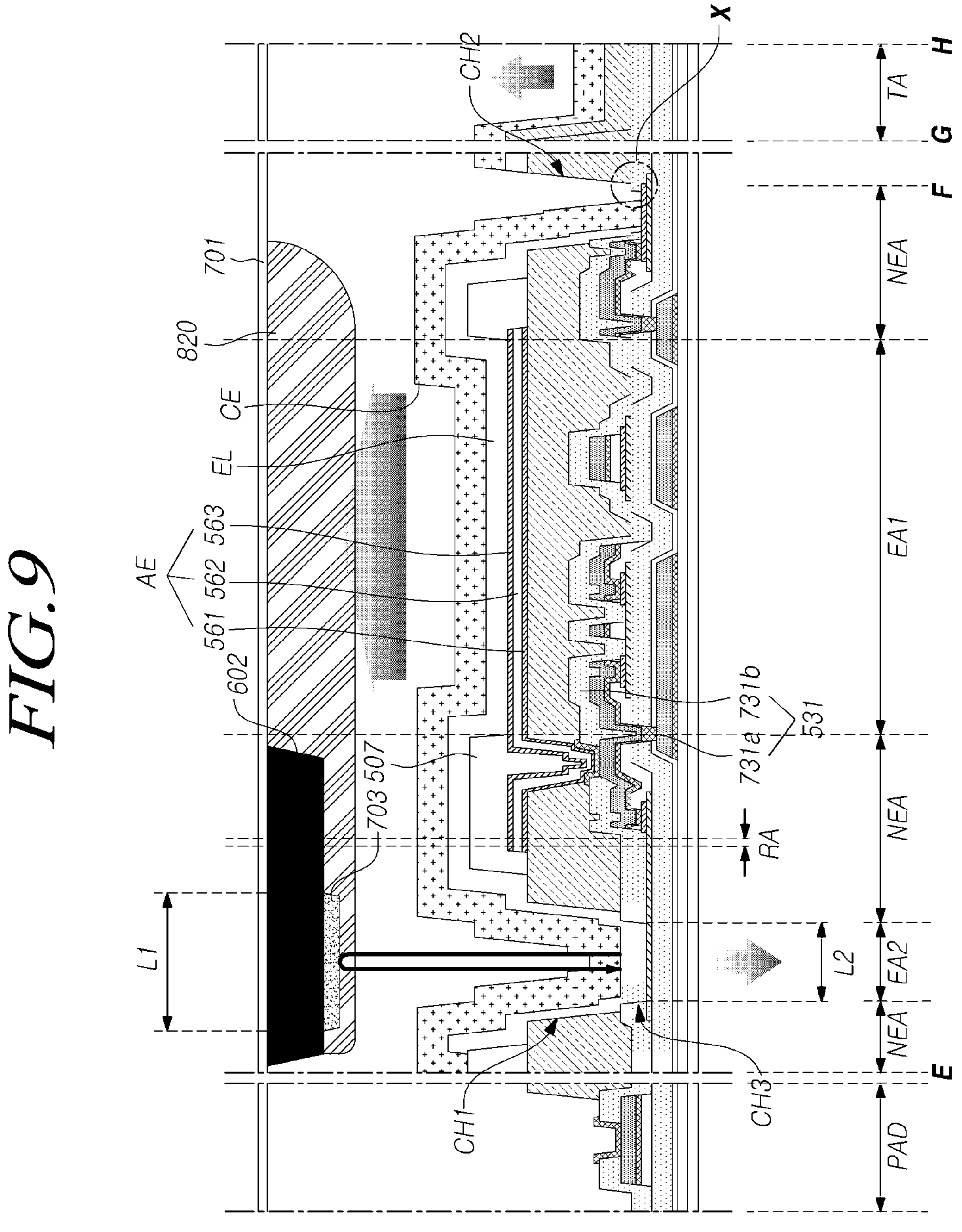

FIGS. 8 and 9 are views illustrating a partial area of a display panel in which a color filter is disposed in a display area according to one embodiment.

The structure of FIG. 8 is a structure in which color filters 810 and 820 are further included in the structure of FIG. 6.

The plurality of color filters 810 and 820 disposed on the display panel according to embodiments of the disclosure may be disposed to correspond to the first emission area EA1, the second emission area EA2, the repair area RA, and the non-emission area NEA.

Although not illustrated in FIG. 8, the plurality of color filters 810 and 820 may include color filters having different colors. For example, the color filters may include a red color filter, a green color filter, and a blue color filter, but embodiments of the disclosure are not limited thereto.

By disposing the color filters 810 and 820 to correspond to the first and second emission areas EA1 and EA2, it is possible to adjust color coordinates of light emitted from each emission area.

FIG. 9 is a structure in which a color filter 820 is added to the structure of FIG. 7.

The plurality of conductive layers 510, CA1, and 517, the plurality of active layers 521, 522, 523, and 524, the plurality of metal layers 525, 526, 527, 528, and 529, the gate electrode 540, the source electrode 531, the drain electrode 532, the first pad electrode 551, the second pad electrode 553, the first insulation film 502, the second insulation film 503, the gate insulation film 504, the third insulation film 505, and the fourth insulation film 506 disposed on the first substrate 501 of FIG. 9 may correspond to the plurality of conductive layers 510, CA1, and 517, the plurality of active layers 521, 522, 523, and 524, the plurality of metal layers 525, 526, 527, 528, and 529, the gate electrode 540, the source electrode 531, the drain electrode 532, the first pad electrode 551, the second pad electrode 553, the first insulation film 502, the second insulation film 503, the gate insulation film 504, the third insulation film 505 and the fourth insulation film 506 described with reference to FIG. 5, and the configurations of the light emitting elements AE, EL, and CE disposed in the first emission area EA1, the light emitting elements 522, EL, and CE disposed in the second emission area EA2, and the black matrix 602 disposed on the second substrate 701 and the reflective member 703 may correspond to the configurations of FIG. 7.

Referring to FIG. 9, a color filter 820 may be disposed on the reflective member 703 and the black matrix 602 disposed on the second substrate 701 in the display area DA of the display panel.

The color filter 820 may be disposed to correspond to the first emission area EA1 and the second emission area EA2.

Accordingly, the light emitted from the first emission area EA1 may be emitted out of the second substrate 701 through the color filter 820.

A portion of the light emitted from the second emission area EA1 may be reflected by the reflective member 703 and, as the path is changed toward the first substrate 701, may be emitted to the outside of the first substrate 501 through the color filter 820 disposed on one surface of the reflective member 703.

Accordingly, the light emitted from the first emission area EA1 and the second emission area EA2 included in one subpixel may be light of the same color as the light emitted from the first emission area EA1 and the second emission area EA2.

In other words, color coordinates of each of the emission areas EA1 and EA2 may be adjusted through the color filter 820.

As described with reference to FIGS. 4 to 9, the first emission area EA1 may emit light in the front direction of the display panel, and the second emission area EA2 may emit light in the front and rear directions of the display panel or may emit light in the rear direction of the display panel.

The second emission area EA2 may be positioned, e.g., only in a portion of the display panel.

This is described below with reference to FIGS. 10 and 11.

Figure 10:
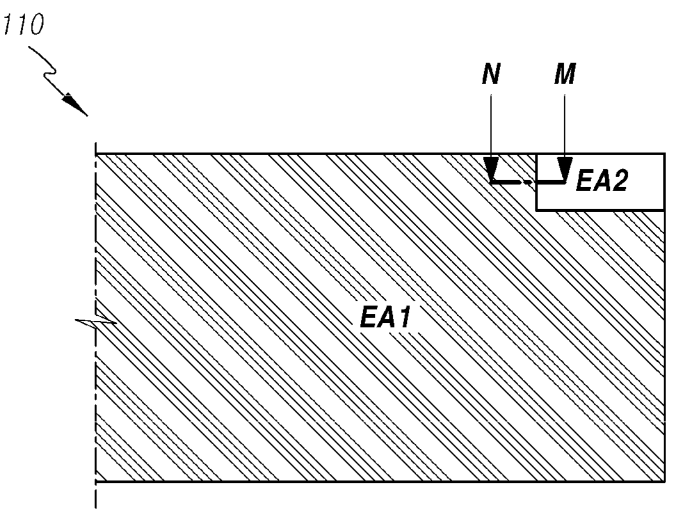
FIG. 10 is a view illustrating an example display device structure to which a display panel according to embodiments of the disclosure is applied.

FIG. 10 is a view illustrating an example display device structure to which a display panel according to embodiments of the disclosure is applied. FIG. 11 is a cross-sectional view taken along M-N of FIG. 10 according to embodiments of the disclosure.

Referring to FIG. 10, the display panel 110 may include a first emission area EA1 and a second emission area EA2, and the second emission area EA2 may be positioned in at least one edge area of the display panel 110.

Figure 11:
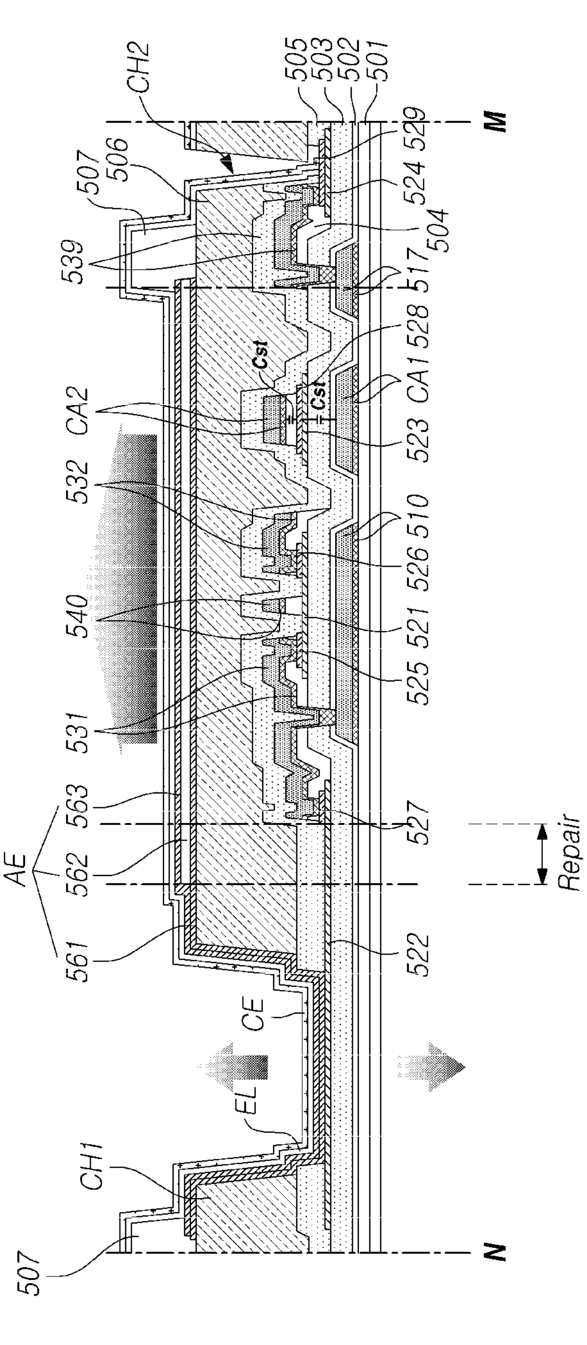
FIG. 11 is a cross-sectional view taken along M-N of FIG. 10 according to embodiments of the disclosure.

Referring to FIGS. 10 and 11, when the display panel 100 is in the ON state, light may be emitted toward the front surface of the display panel in the first emission area EA1, and an image may be visible. In the second emission area EA2, light may be emitted in the front and rear directions of the display panel, and an image may be visible in both directions.

In the second emission area EA2, not only information such as date, weather, etc., but also channel information, etc. may be provided in a viewing environment of the display panel.

FIG. 11 illustrates a structure in which light is emitted from the second emission area EA2 in the front and rear directions of the display panel 110 as illustrated in FIG. 5, but the second emission area EA2 of the display panel according to embodiments of the disclosure may emit light only in the rear direction of the display panel as illustrated in FIGS. 7 and 9.

The foregoing embodiments are briefly described below.

An organic light emitting display device may comprise a first substrate 501 including at least one first emission area EA1 and at least one second emission area EA2, a thin film transistor including a first active layer 521 disposed in the first emission area EA1 of the first substrate 501, a second active layer 522 overlapping the second emission area EA2 of the first substrate 501, electrically connected to the thin film transistor, and disposed on the same layer as the first active layer 521, and a light emitting element ED electrically connected to the thin film transistor and including an anode electrode AE, a light emitting layer EL, and a cathode electrode CE disposed in the first emission area EA1. The light emitting layer EL and the cathode electrode CE may be disposed on the second active layer 522 in the second emission area EA2. Light emitted from the first emission area EA1 may be emitted in one direction. At least a portion of light emitted from the second emission area EA2 may be emitted in a direction different from the one direction in which the light emitted from the first emission area EA1 is emitted.

At least one insulation film 505 or 506 disposed on the thin film transistor may be disposed on the first substrate 501. The insulation film 505 or 506 may expose a portion of an upper surface of the second active layer 522 through a hole CH1 or CH3 provided in an area corresponding to the second emission area EA2.

A metal layer 527 may be disposed on a portion of an upper surface of the second active layer 522. The metal layer 527 may contact a source electrode 531 or drain electrode 532 of the thin film transistor.

An area where the second active layer 522 does not overlap the metal layer 527 may be a conductive area.

The anode electrode AE may include a first electrode layer 561, a second electrode layer 562 disposed on the first electrode layer 561, and a third electrode layer 563 disposed on the second electrode layer 562. The first and third electrode layers 561 and 563 may include a transparent conductive material. The second electrode layer 562 may include a conductive material capable of reflecting light.

In the second emission area EA2, a first electrode layer 561 may be disposed on the second active layer 522. A third electrode layer 563 may be disposed on the first electrode layer 561. The light emitting layer EL of the light emitting element ED may be disposed on the third electrode layer 563. The cathode electrode CE of the light emitting element ED may be disposed on the light emitting layer EL.

At least one subpixel may include the first emission area EA1, the second emission area EA2, and a repair area RA. The anode electrode AE may be disposed in the first emission area EA1 and the repair area RA. The first and third electrode layers 561 and 563 of the anode electrode AE may extend to the second emission area EA2.

In the second emission area EA2, the first and third electrode layers 561 and 563 may be electrically connected to the second active layer 522.

The repair area RA may overlap the first emission area EA1.

A portion of the light emitted from the second emission area EA2 may be emitted in the same direction as the light emitted from the first emission area EA1. Another portion of the light emitted from the second emission area EA2 may be emitted in an opposite direction to the light emitted from the first emission area EA1.

The organic light emitting display device may further comprise a second substrate 701 facing the first substrate 501. A black matrix 602 overlapping the second emission area EA2 may be disposed on one surface of the second substrate 701.

The black matrix 602 may overlap at least a portion of a bank 507 disposed between the first emission area EA1 and the second emission area EA2.

In the second emission area EA2, an upper surface of the second active layer 522 and the light emitting layer EL may contact each other.

The organic light emitting display device may further comprise a reflective member 703 disposed on the black matrix 602.

The reflective member 703 may be disposed at a position corresponding to the second emission area EA2.

The light emitted from the second emission area EA2 may be emitted out of the first substrate 501.

The organic light emitting display device may further comprise a color filter 810 or 820 disposed on one surface of the second substrate 701 where the black matrix 602 is disposed. The color filter 810 or 820 may overlap the first emission area EA1 and the second emission area EA2.

The second emission area EA2 may be disposed in at least one edge area of the organic light emitting display panel.

A transmissive area TA may be disposed on one side of one subpixel.

According to embodiments of the disclosure, there may be provided an organic light emitting display panel and an organic light emitting display device capable of preventing a reduction in the emission area due to the repair area by disposing the repair pattern disposed in the repair area to overlap the active layer and the first emission area.

According to embodiments of the disclosure, there may be provided an organic light emitting display panel and an organic light emitting display device capable of minimizing damage due to etching while simplifying the process by including the active layer in the electrode included in the emission area and the repair pattern.

According to embodiments of the disclosure, there may be provided an organic light emitting display panel and an organic light emitting display device capable of adjusting the color coordinates of each emission area while enhancing the luminance of the rear emission area as well as the front emission area.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. An organic light emitting display device, comprising:

a first substrate including at least one first emission area and at least one second emission area;

a thin film transistor including a first active layer in the at least one first emission area of the first substrate;

a second active layer overlapping the at least one second emission area of the first substrate, electrically connected to the thin film transistor in the at least one first emission area to enable the at least one second emission area to emit light, and spaced apart from the first active layer on a same layer as the first active layer; and a light emitting element electrically connected to the thin film transistor, the light emitting element including an anode electrode, a light emitting layer, and a cathode electrode in the at least one first emission area, wherein the light emitting layer and the cathode electrode are on the second active layer in the at least one second emission area, wherein light emitted from the at least one first emission area is emitted in one direction, and wherein at least a portion of light emitted from the at least one second emission area is emitted in a direction different from the one direction in which the light emitted from the at least one first emission area is emitted.

2. The organic light emitting display device of claim 1, further comprising:

at least one insulation film disposed on the thin film transistor is disposed on the first substrate, and wherein the at least one insulation film exposes a portion of an upper surface of the second active layer through a hole in an area corresponding to the at least one second emission area.

3. The organic light emitting display device of claim 1, further comprising:

a metal layer is on a portion of an upper surface of the second active layer, the metal layer contacting a source electrode or a drain electrode of the thin film transistor.

4. The organic light emitting display device of claim 3, wherein an area where the second active layer is non-overlapping with the metal layer is a conductive area.

5. The organic light emitting display device of claim 1, wherein the anode electrode includes a first electrode layer, a second electrode layer on the first electrode layer, and a third electrode layer on the second electrode layer, wherein the first electrode layer and the third electrode layer include a transparent conductive material, and wherein the second electrode layer includes a conductive material configured to reflect light.

6. The organic light emitting display device of claim 5, wherein in the at least one second emission area, the first electrode layer is on the second active layer, wherein the third electrode layer is on the first electrode layer, wherein the light emitting layer of the light emitting element is on the third electrode layer, and wherein the cathode electrode of the light emitting element is on the light emitting layer.

7. The organic light emitting display device of claim 5, wherein at least one subpixel includes the at least one first emission area, the at least one second emission area, and a repair area, wherein the anode electrode is in the at least one first emission area and the repair area, and wherein the first electrode layer and the third electrode layer of the anode electrode extend to the at least one second emission area.

8. The organic light emitting display device of claim 7, wherein in the at least one second emission area, the first electrode layer and the third electrode layer are electrically connected to the second active layer.

9. The organic light emitting display device of claim 7, wherein the repair area overlaps the at least one first emission area.

10. The organic light emitting display device of claim 6, wherein a portion of the light emitted from the at least one second emission area is emitted in a same direction as the light emitted from the at least one first emission area, and wherein another portion of the light emitted from the at least one second emission area is emitted in an opposite direction to the light emitted from the at least one first emission area.

11. The organic light emitting display device of claim 1, further comprising:

a second substrate facing the first substrate; and a black matrix overlapping the at least one second emission area and on one surface of the second substrate.

12. The organic light emitting display device of claim 11, wherein the black matrix overlaps at least a portion of a bank disposed between the at least one first emission area and the at least one second emission area.

13. The organic light emitting display device of claim 11, wherein in the at least one second emission area, an upper surface of the second active layer and the light emitting layer contact each other.

14. The organic light emitting display device of claim 11, further comprising:

a reflective member on the black matrix.

15. The organic light emitting display device of claim 14, wherein the reflective member is at a position corresponding to the at least one second emission area.

16. The organic light emitting display device of claim 14, wherein the light emitted from the at least one second emission area is emitted out of the first substrate.

17. The organic light emitting display device of claim 11, further comprising:

a color filter on one surface of the second substrate where the black matrix is disposed, wherein the color filter overlaps the at least one first emission area and the at least one second emission area.

18. The organic light emitting display device of claim 1, wherein the at least one second emission area is in at least one edge area of the organic light emitting display device.

19. The organic light emitting display device of claim 1, wherein a transmissive area is on one side of at least one subpixel.

20. The organic light emitting display device of claim 1, wherein the at least one second emission area is on one side of a data line and a driving voltage line, and wherein at least one other second emission area is on one side of the data line and a reference voltage line.

21. The organic light emitting display device of claim 1, wherein the at least one second emission area is between a data line and a transmissive area.

22. An organic light emitting display panel, comprising:

a first substrate including at least one first emission area and at least one second emission area;

a thin film transistor in the at least one first emission area of the first substrate, the thin film transistor including a first active layer;

a second active layer overlapping the at least one second emission area of the first substrate, electrically connected to the thin film transistor in the at least one first emission area to enable the at least one second emission area to emit light, and spaced apart from the first active layer on a same layer as the first active layer; and a light emitting element electrically connected to the thin film transistor, the light emitting element including an anode electrode, a light emitting layer, and a cathode electrode in the at least one first emission area, wherein the light emitting layer and the cathode electrode are on the first active layer of the at least one second emission area.

* * * * *